US012586754B2

(12) United States Patent
Takahashi et al.

(10) Patent No.: US 12,586,754 B2
(45) Date of Patent: Mar. 24, 2026

(54) PHASE IMAGE PROCESSING APPARATUS AND PHASE IMAGE PROCESSING METHOD

(71) Applicant: Hitachi, Ltd., Tokyo (JP)

(72) Inventors: Yoshio Takahashi, Tokyo (JP); Tetsuya Akashi, Tokyo (JP); Toshiaki Tanigaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 459 days.

(21) Appl. No.: 18/107,150

(22) Filed: Feb. 8, 2023

(65) Prior Publication Data

US 2024/0021406 A1    Jan. 18, 2024

(30) Foreign Application Priority Data

Jul. 14, 2022    (JP) ................................. 2022-113080

(51) Int. Cl.
    *H01J 37/22*        (2006.01)
    *H01J 37/26*        (2006.01)
(52) U.S. Cl.
    CPC ............ *H01J 37/26* (2013.01); *H01J 37/222* (2013.01); *H01J 2237/2614* (2013.01)
(58) Field of Classification Search
    None
    See application file for complete search history.

(56) References Cited

U.S. PATENT DOCUMENTS

| | | | | |
|---|---|---|---|---|
| 5,654,547 A | * | 8/1997 | Coene ................... | H01J 37/222 |
| | | | | 250/311 |
| 2003/0227658 A1 | * | 12/2003 | Thomas ............... | G03H 1/0406 |
| | | | | 359/35 |
| 2010/0246765 A1 | * | 9/2010 | Murakoshi ........... | G01N 23/041 |
| | | | | 378/62 |

(Continued)

FOREIGN PATENT DOCUMENTS

JP        2000097633 A  *  4/2000

OTHER PUBLICATIONS

English machine translation for JP-2000097633-A (Year: 2000).*

(Continued)

*Primary Examiner* — Wyatt A Stoffa
*Assistant Examiner* — Alina Kaliszewski
(74) *Attorney, Agent, or Firm* — PROCOPIO, CORY, HARGREAVES & SAVITCH LLP

(57)        ABSTRACT

There is provided a phase-image processing apparatus and a phase-image processing method capable of highly accurately correcting a phase singularity included in a phase image. A phase-image processing apparatus that applies image processing to a phase image includes: a fringe pattern-creating unit that creates a plurality of fringe patterns based on a first interference fringe image corresponding to a first phase image including a phase singularity; a patch image-creating unit that creates a patch image based on the fringe pattern; an interference fringe image correcting unit that pastes the patch image to an area of the first interference fringe image corresponding to the phase singularity, corrects (Continued)

the first interference fringe image, and creates a second interference fringe image; and a phase image correcting unit that creates a second phase image from the second interference fringe image.

15 Claims, 9 Drawing Sheets

(56)                    References Cited

U.S. PATENT DOCUMENTS

| | | | | |
|---|---|---|---|---|
| 2014/0226003 | A1* | 8/2014 | Phaneuf | H01J 37/222 |
| | | | | 348/80 |
| 2015/0146196 | A1* | 5/2015 | Huang | G01M 11/0257 |
| | | | | 356/121 |
| 2015/0279027 | A1* | 10/2015 | Nagai | H04N 25/67 |
| | | | | 382/132 |
| 2015/0310609 | A1* | 10/2015 | Sperl | G01N 23/041 |
| | | | | 382/132 |
| 2016/0109387 | A1* | 4/2016 | Pan | G01N 23/041 |
| | | | | 378/36 |
| 2016/0131767 | A1* | 5/2016 | Fletcher | G01T 7/00 |
| | | | | 250/336.1 |
| 2021/0110992 | A1* | 4/2021 | Takahashi | H01J 37/26 |

OTHER PUBLICATIONS

Hirose, Akira, Singularity-spreading phase unwrapping: Its basic idea and the influence of time and space discreteness on the dynamics, The University of Tokyo, Tokyo, Japan, Nov. 12-15, 2018, 5 pages.

* cited by examiner

101 PHASE IMAGE PROCESSING APPARATUS

INTERFERENCE FRINGE IMAGE

PHASE IMAGE

DISCRETE
FOURIER
TRANSFORM

VERTICAL
FREQUENCY

HORIZONTAL
FREQUENCY

Sideband

TWO-DIMENSIONAL SPATIAL
FREQUENCY SPECTRUM

INTERFERENCE FRINGE IMAGE PREPARED
FROM PHASE IMAGE

INTERFERENCE FRINGE IMAGE

DISCRETE
FOURIER
TRANSFORM

Sideband

TWO-DIMENSIONAL SPATIAL
FREQUENCY SPECTRUM

PLURALITY OF
FRINGE PATTERNS

PHASE IMAGE CREATED FROM CORRECTED
INTERFERENCE FRINGE IMAGE

PHASE IMAGE PROCESSING APPARATUS AND PHASE IMAGE PROCESSING METHOD

CLAIM OF PRIORITY

The present application claims priority from Japanese Patent Application JP 2022-113080 filed on Jul. 14, 2022, the content of which is hereby incorporated by reference into this application.

BACKGROUND OF THE INVENTION

The present invention relates to a phase-image processing apparatus and a phase-image processing method that apply image processing to a phase image prepared from an interference fringe image obtained by using waves such as electrons, light, radio waves, and the like, and particularly to a technique that corrects a phase singularity included in a phase image.

The interference fringe image is an image that is obtained by causing interference between an object wave, which is a wave obtained from an observation target, and a reference wave, which is a wave to be a reference, and the interference fringe image is imaged, for example, by a transmission electron microscope (TEM) including an electron biprism. Since the phase image prepared from the interference fringe image includes more detailed data of the observation target, the phase image is prepared from the interference fringe image imaged by the TEM, for example, a magnetic domain in the inside of a magnet, the distribution of electric charges of a semiconductor interface, the mean inner potential of nanoparticles, and the like can be obtained.

The course of preparing the phase image from the interference fringe image includes an inverse trigonometric function operation, and the obtained phase value is wrapped in the range of $[-\pi, \pi)$ [rad]. Therefore, the phase image has to be subjected to the process of unwrapping the wrapped phase value, a so-called unwrapping process. However, in the case where the phase image includes a phase singularity, the unwrapping process is hindered.

Akira Hirose, Singularity-spreading phase unwrapping: Its basic idea and the influence of time and space discreteness on the dynamics, APSIPA Annual Summit and Conference 2018, Hawaii, November 2018, pp. 99-103 discloses that by radially spreading the phase singularity outward, the influence of the phase singularity is reduced while calculation costs are suppressed.

SUMMARY OF THE INVENTION

However, in Akira Hirose, Singularity-spreading phase unwrapping: Its basic idea and the influence of time and space discreteness on the dynamics, APSIPA Annual Summit and Conference 2018, Hawaii, November 2018, pp. 99-103, it is difficult to sufficiently reduce the influence of the phase singularity.

Therefore, an object of the present invention is to provide a phase-image processing apparatus and a phase-image processing method capable of highly accurately correcting a phase singularity included in a phase image.

In order to achieve the object, an aspect of the present invention is a phase-image processing apparatus that applies image processing to a phase image, the apparatus including: a fringe pattern-creating unit that creates a plurality of fringe patterns based on a first interference fringe image corresponding to a first phase image including a phase singularity; a patch image-creating unit that creates a patch image based on the fringe pattern; an interference fringe image correcting unit that pastes the patch image to an area of the first interference fringe image corresponding to the phase singularity, corrects the first interference fringe image, and creates a second interference fringe image; and a phase image correcting unit that creates a second phase image from the second interference fringe image.

An aspect of the present invention is a phase-image processing method that applies image processing to a phase image, the method including: creating a plurality of fringe patterns based on a first interference fringe image corresponding to a first phase image including a phase singularity; creating a patch image based on the fringe pattern; and pasting the patch image to an area of the first interference fringe image corresponding to the phase singularity, correcting the first interference fringe image, and creating a second interference fringe image; and creating a second phase image from the second interference fringe image.

According to the present invention, it is possible to provide a phase-image processing apparatus and a phase-image processing method capable of highly accurately correcting a phase singularity included in a phase image.

DETAILED DESCRIPTION OF THE PREFERRED EMBODIMENTS

In the following, an embodiment of a phase-image processing apparatus and a phase-image processing method according to the present invention will be described with reference to the accompanying drawings. Note that in the following description and the accompanying drawings, components having the same functional configuration are designated with the same reference signs, and the redundant description is omitted.

First Embodiment

Figure 1:
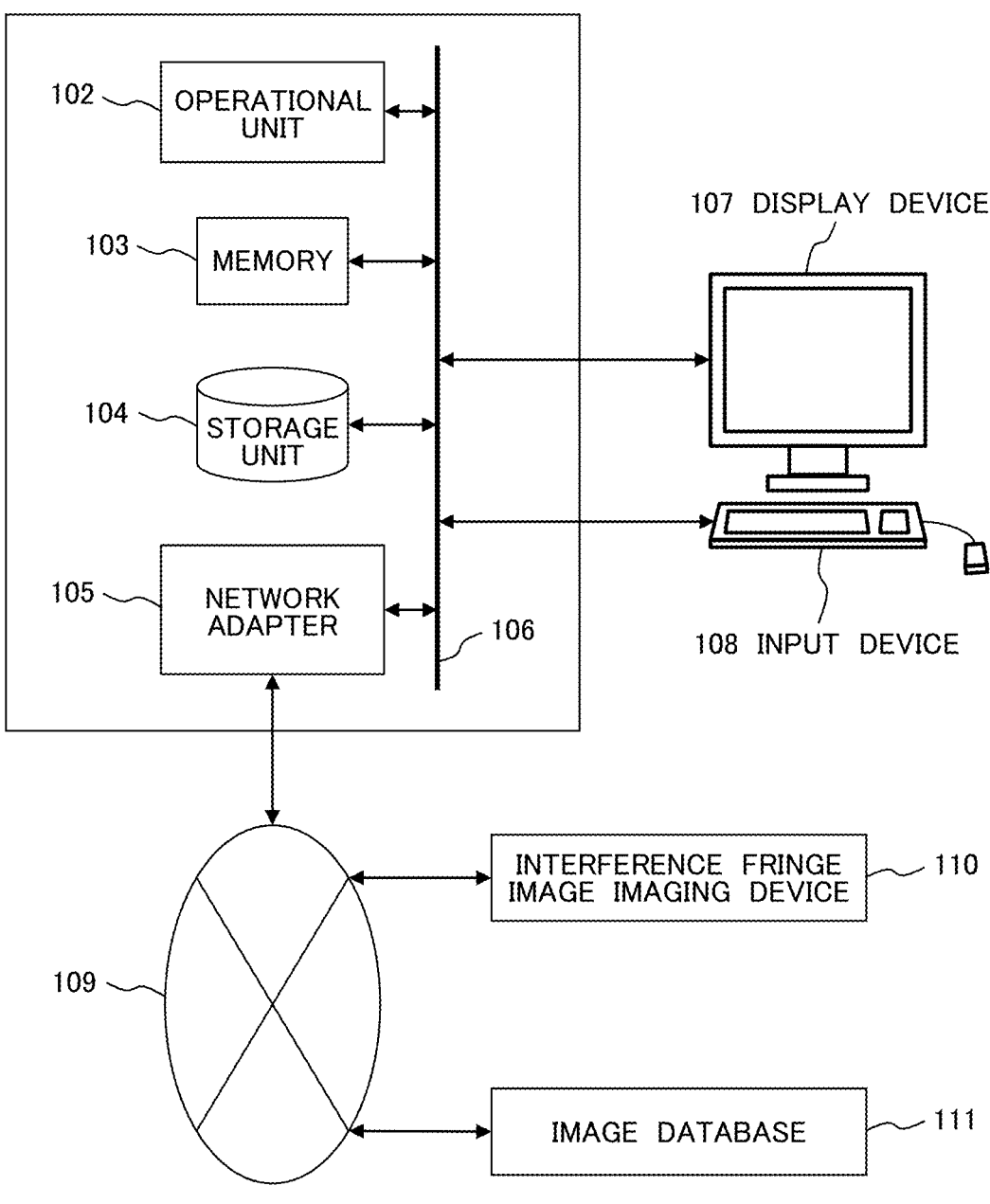
FIG. 1 is a diagram of the overall structure of a phase-image processing apparatus.

FIG. 1 is a diagram showing the hardware configuration of a phase-image processing apparatus 101. The phase-image processing apparatus 101 is configured such that an operational unit 102, a memory 103, a storage unit 104, and a network adapter 105 are connected through a system bus 106 to make signals receivable and transmutable. The phase-image processing apparatus 101 is connected to an interference fringe image imaging device 110 and an image database 111 via a network 109 to make signals receivable and transmutable. To the phase-image processing apparatus 101, a display device 107 and an input device 108 are further connected. Here, the phrase "to make signals receivable and transmutable" expresses a state where signals are electrically and optically receivable and transmutable mutually or from one to the other, regardless of cable and wireless manners.

The operational unit 102 is a device that controls the operation of the components, specifically a Central Processing Unit (CPU), a Micro Processor Unit), or the like. The operational unit 102 loads a program stored in the storage unit 104 or data necessary to execute the program to the memory 103 for execution, and applies various image processes to a phase image. The memory 103 is a device that stores the program executed by the operational unit 102 and the midway point of a lapse of the arithmetic operation process. The storage unit 104 is a device that stores the program executed by the operational unit 102 and data necessary to execute the program, specifically a Hard Disk Drive (HDD), a Solid State Drive (SSD), and the like. The network adapter 105 is a device that connects the phase-image processing apparatus 101 to the network 109 such as a Local Area Network (LAN), a telephone circuit, the Internet, and the like. Various items of data handled by the operational unit 102 may be received from and transmitted to the outside of the phase-image processing apparatus 101 via the network 109 such as a LAN.

The display device 107 is a device that displays the processed result and the like of the phase-image processing apparatus 101, specifically a liquid crystal display and the like. The input device 108 is an operating device used by an operator to operate and instruct the phase-image processing apparatus 101, specifically a keyboard, a mouse, a touch panel, and the like. The mouse may be a pointing device such as a trackpad and a trackball.

The interference fringe image imaging device 110 is a device that images an interference fringe image obtained by interference between an object wave which is a wave created by reflection or transmutation of a wave applied to an observation target and a reference wave which is a reference wave. The wave applied to the observation target is a coherent wave such as light, laser beams, radio waves, and electron waves. The interference fringe image imaging device 110 is, for example, a transmission electron microscope (TEM) including an electron biprism, and the TEM including the electron biprism images an electron beam hologram as an interference fringe image.

The image database 111 is a database system that stores an interference fringe image acquired by the interference fringe image imaging device 110, a phase image prepared from the interference fringe image, and the like. The phase image is prepared by subjecting the interference fringe image to the arithmetic operation process using a Fourier transform method, a fringe scanning method, and the like.

Figure 2:
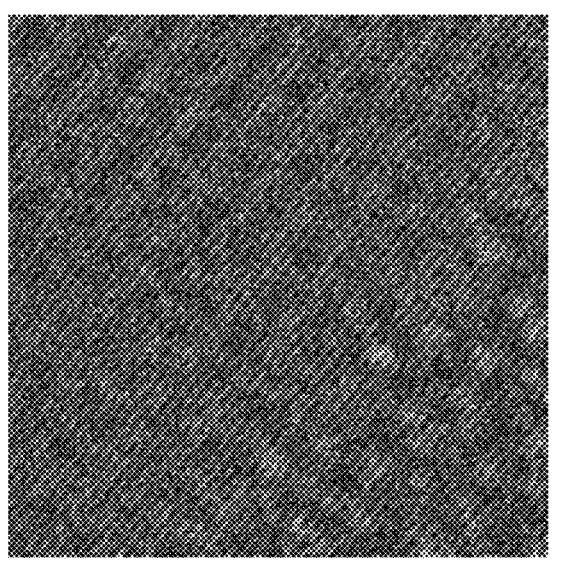
FIG. 2 is a diagram showing examples of an interference fringe image, a two-dimensional spatial frequency spectrum, and a phase image.
Figure 2:
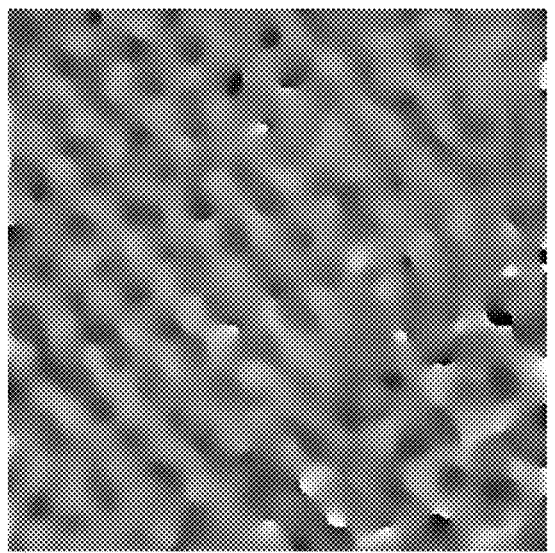
Figure 2:
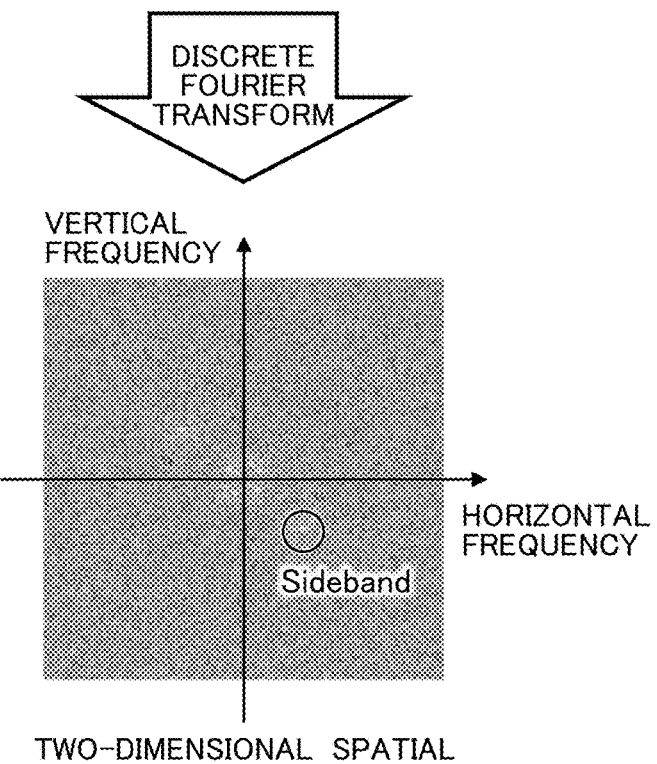

Referring to FIG. 2, an example of procedures for preparing a phase image from an interference fringe image using a Fourier transform method will be described. The interference fringe image exemplified in FIG. 2 is an image imaged by the TEM including an electron biprism, and the image includes interference fringes which are fine fringe patterns going from the upper right to the lower left.

The interference fringe image in FIG. 2 is discrete Fourier transformed, and then a two-dimensional spatial frequency spectrum exemplified in FIG. 2 is obtained. The two-dimensional spatial frequency spectrum is a spectrum in which the intensity for every spatial frequency is plotted on a plane whose horizontal axis is the horizontal frequency and whose vertical axis is the vertical frequency. At the intersection point of these axes, the intensity of zero spatial frequency, i.e., a direct current component is plotted. Since the interference fringe image includes interference fringes going from the upper right to the lower left, a high-brightness area referred to as a sideband appears in the second quadrant and the fourth quadrant of the two-dimensional spatial frequency spectrum.

Subsequently, the sideband is cut from the two-dimensional spatial frequency spectrum, the sideband is pasted to the center of a new two-dimensional spatial frequency spectrum, i.e., at the position of the zero spatial frequency to conduct inverse discrete Fourier transform, and then a complex image $R(x, y)+iI(x, y)$ is obtained, where $(x, y)$ are the coordinates of the 2-dimensional image and $i$ is an imaginary unit. The phase image as illustrated in FIG. 2 is obtained by the following formula.

$$\text{atan } 2(R(x,y),I(x,y)) \tag{Formula 1}$$

where atan 2( ) is the inverse function of tan( ) with two variables. Since the phase values obtained by (Formula 1) are wrapped into the range of $[-\pi, \pi)$ [rad], it is necessary to unwrap the wrapped phase values.

However, in the case where the phase image includes a phase singularity, the unwrapping process is hindered. Therefore, in the first embodiment, the process flow for correcting the phase singularity included in the phase image with high accuracy is performed.

Figure 3:
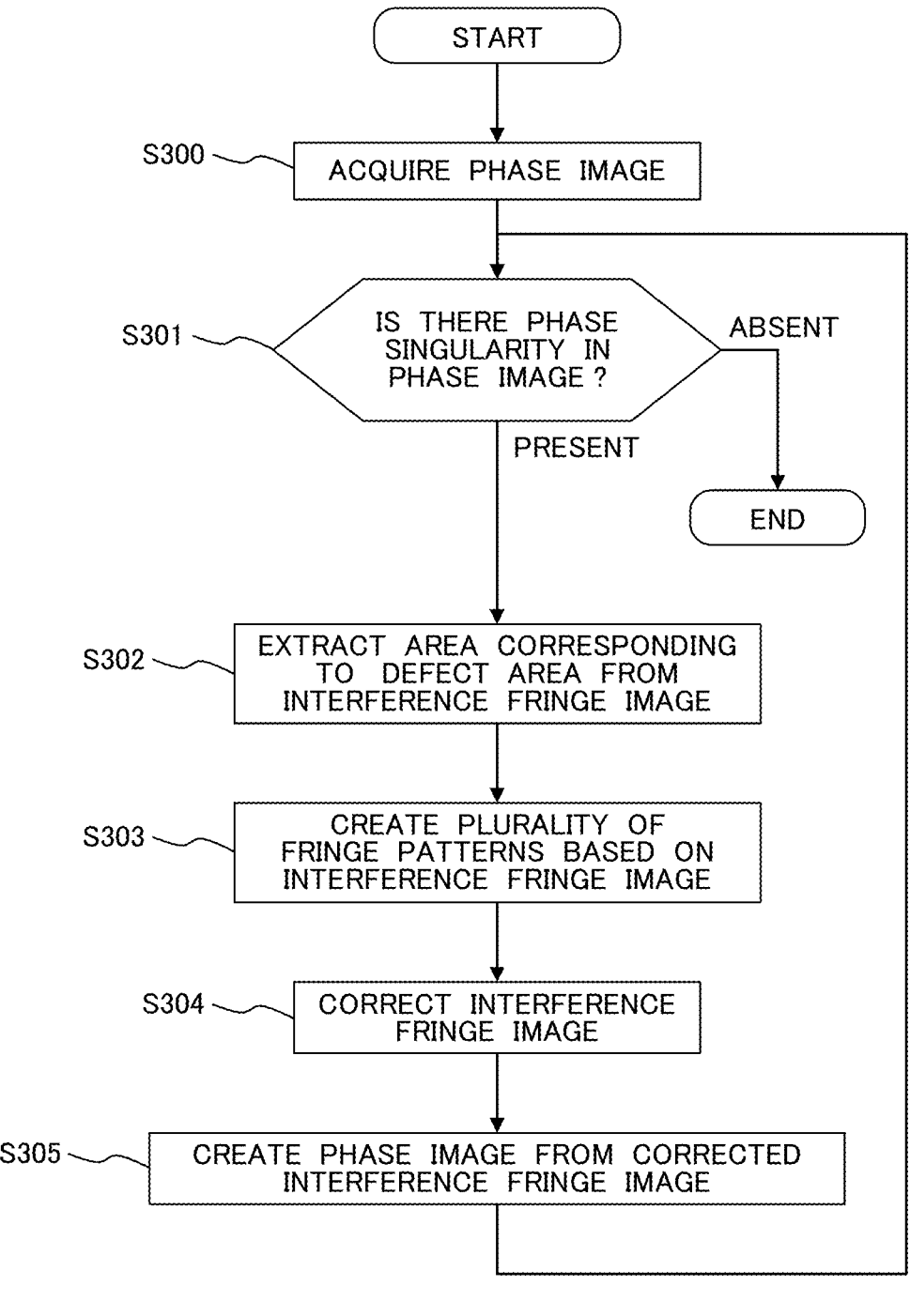
FIG. 3 is a diagram showing an example flow of a process according to a first embodiment.

Referring to FIG. 3, an example of a process executed in the first embodiment will be described step by step.
(S300)
The operational unit 102 acquires a phase image. Specifically, a phase image is prepared from the interference fringe image imaged by the interference fringe image imaging device 110 using (Formula 1), or a phase image stored in advance in the storage unit 104 or the image database 111 is read.
(S301)
The operational unit 102 determines whether there is a phase singularity in the phase image acquired in S300, or a phase image to be created in S305 described later. In the case where there is a phase singularity in the phase image, the process proceeds to S302, and if not, the process is terminated.

The presence or absence of a phase singularity is determined based on, for example, the local circumferential integral of the phase gradient, and specifically the following formula is used.

$$W(\text{upper right--upper left})+W(\text{upper left--lower left})+ \\ W(\text{lower left--lower right})+W(\text{lower right--upper right}) \tag{Formula 2}$$

where W(upper right–upper left) is a function that returns 1 when the value obtained by subtracting the upper left pixel value from the upper right pixel value in the four adjacent 2×2 pixels is $\pi$ [rad] or more, −1 when the value is $-\pi$ [rad] or less, and 0 when the value is within $[-\pi, \pi)$ [rad]. When the value of (Formula 2) is not 0, it is determined that there is a phase singularity at the center point of the four pixels, and the four pixels around the phase singularity are extracted as the defect area, which is the area containing the phase singularity.

Note that the determination of the presence or absence of a phase singularity is not limited to the use of (Formula 2). For example, a boundary line may be formed by connecting pixel boundaries where the difference in pixel values between adjacent pixels in the phase image is π [rad] or more, the end point where the line is broken may be determined to be a phase singularity, and the four pixels around the end point may be extracted as the defective area.

(S302)

Figure 4:
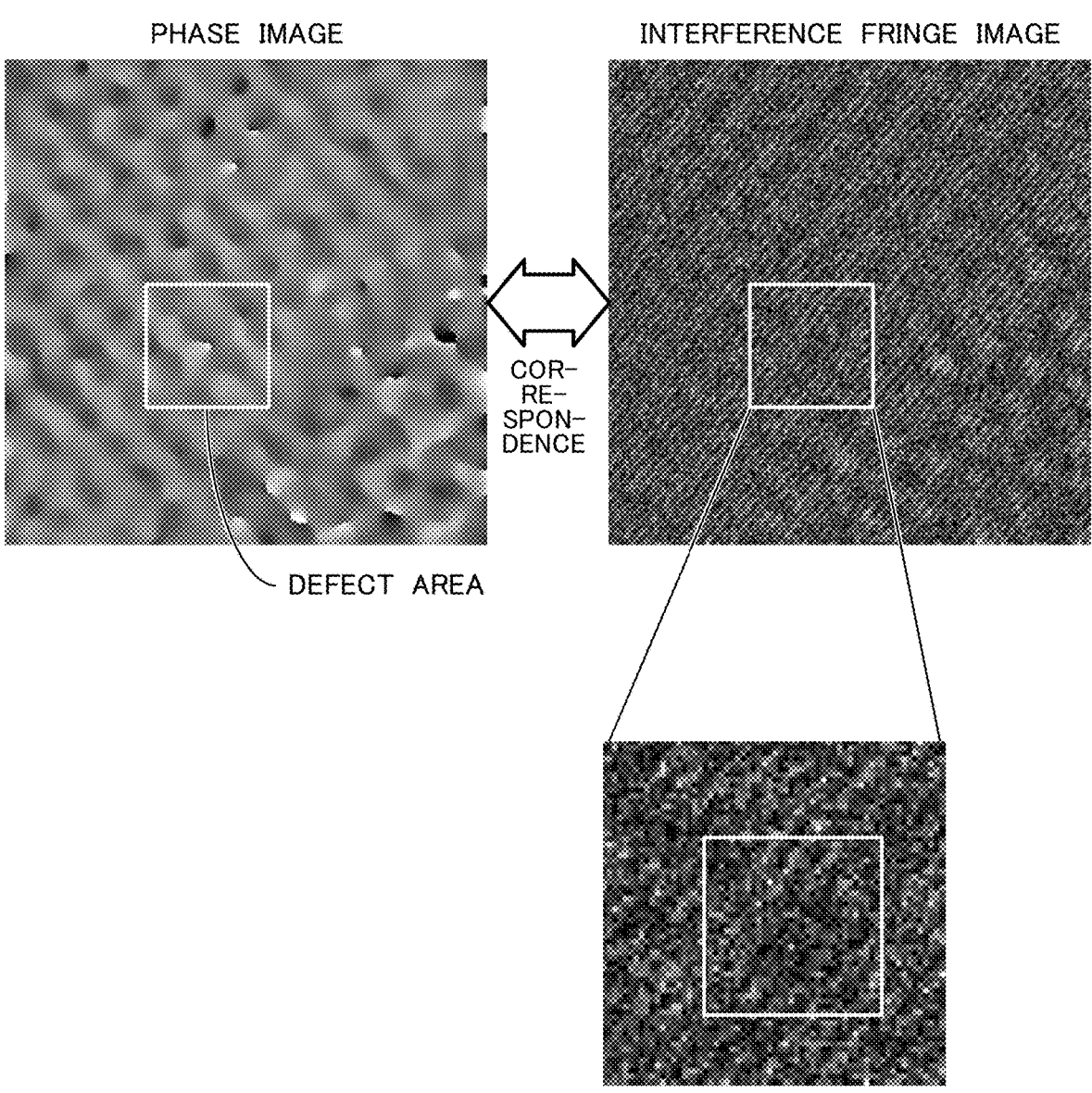
FIG. 4 is a diagram showing examples of areas of an interference fringe image corresponding to the defect area of a phase image.

The operational unit 102 extracts the area corresponding to the defect area extracted in S301 from the interference fringe image corresponding to the phase image. Specifically, an area with the same coordinates as the defect area is extracted from the interference fringe image. The area of the interference fringe image corresponding to the defect area has a blurred stripe pattern, as illustrated in FIG. 4.

Figure 5:
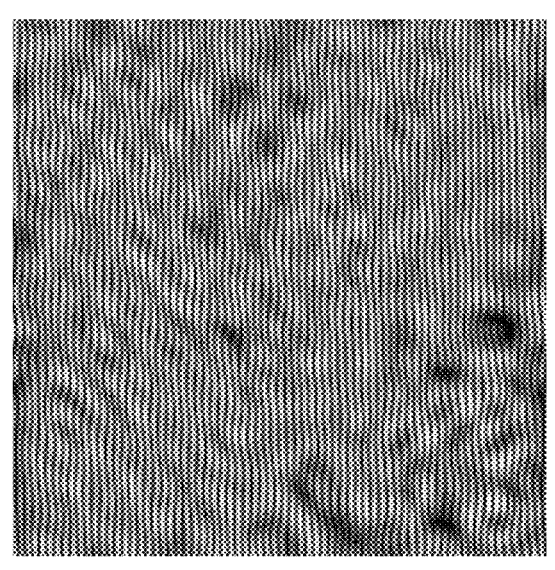
FIG. 5 is a diagram showing an example of an interference fringe image prepared from a phase image.

Note that in the case where there is no interference fringe image corresponding to the phase image, a new interference fringe image corresponding to the phase image may be prepared by the following formula.

$$|exp[ikx]+exp[i\phi(x,y)]|^2 \qquad \text{(Formula 3)}$$

where $\phi(x, y)$ is the phase image, $2\pi/k$ is the fringe period of the interference fringe to be created, and exp[ ] is an exponential function with the base of Napier number. By using (Formula 3), a periodic interference fringe image in the horizontal direction, as exemplified in FIG. 5, is prepared.

(S303)

The operational unit 102 creates a plurality of fringe patterns based on the interference fringe image corresponding to the phase image acquired in S300 or the phase image created in S305, which will be described later.

Figure 6:
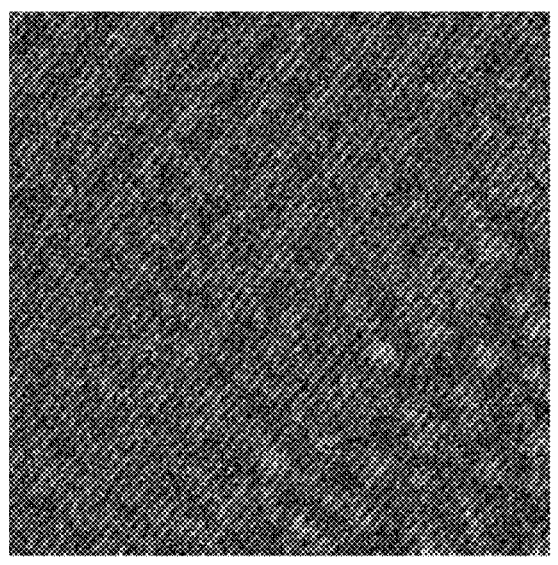
FIG. 6 is a diagram showing an example of procedures for creating a plurality of fringe patterns.
Figure 6:
Figure 6:
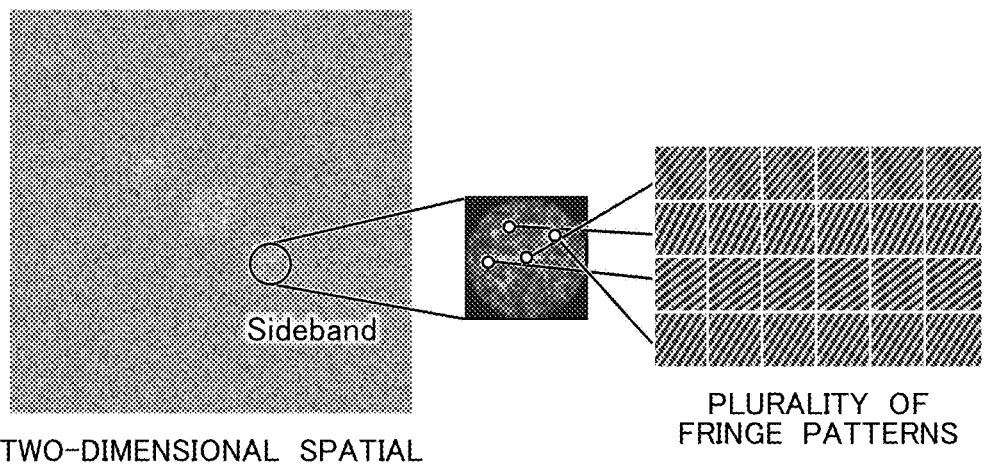

Referring to FIG. 6, an example of procedures for creating a plurality of fringe patterns will be described. First, a two-dimensional spatial frequency spectrum is obtained by discrete Fourier transforming the interference fringe image corresponding to the phase image. Subsequently, the position of the peak intensity is searched from the two-dimensional spatial frequency spectrum, and sidebands, which are areas around the position of the peak intensity, are extracted. Since the coordinates of each pixel in the sidebands indicate the direction and pitch of the stripes, a stripe pattern corresponding to each coordinate is created. Furthermore, by shifting the phase of the stripe pattern for each coordinate by one pixel, multiple stripe patterns with different phases are created. The 24 stripe patterns exemplified in FIG. 6 are the result of creating six stripe patterns with different phases at each of the four coordinates in the sidebands.

Note that the size of the stripe pattern is preferably the size of the defect area or less, e.g., one-fourth of the size of the defect area. However, the size of the stripe pattern has to be 16 pixels (4×4) or more such that the stripe pattern is clearly shown.

(S304)

Figure 7:
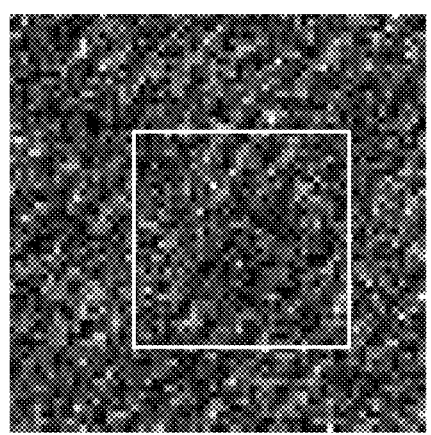
FIG. 7 is a diagram showing an example of a corrected interference fringe image.
Figure 7:
Figure 7:
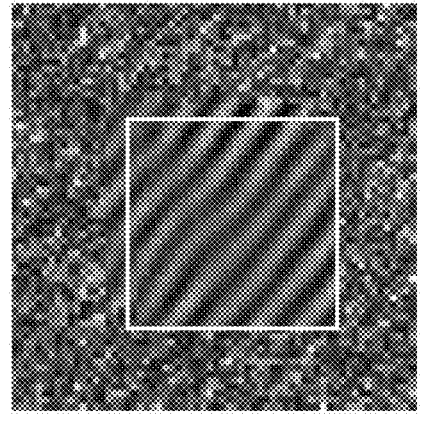

The operational unit 102 creates a patch image using the stripe pattern created in S303, and corrects the interference fringe image by pasting the created patch image onto the interference fringe image. FIG. 7 shows an example of a corrected interference fringe image. The stripe pattern, which is blurred before correction, becomes clearer by pasting the patch image.

The patch image is created, for example, by weighted addition of the plurality of stripe patterns. Assuming that the period and direction of the stripe patterns in the patch image are formed of sparse stripe pattern pairs, the sparse coding algorithm can be used, and the patch image can be formed with a combination of a fewer stripe pattern, and thus it is possible to reduce processing time.

6

(S305)

Figure 8:
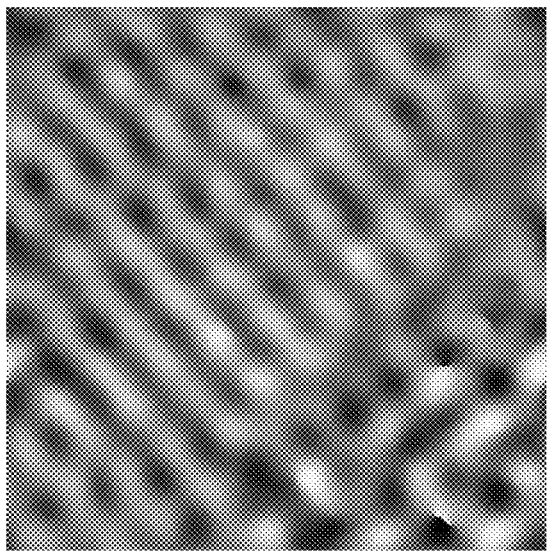
FIG. 8 is a diagram showing an example of a phase image created from a corrected interference fringe image.

The operational unit 102 creates a phase image from the corrected interference fringe image in S304. For example, (Formula 2) is used to create the phase image. FIG. 8 shows an example of a phase image created from the corrected interferogram image.

In the phase image created in step S305, the presence or absence of a phase singularity is determined in S301. When any phase singularity remains, the process from step S302 to step S305 is repeated. Note that the iterative process may be terminated when the number of phase singularities becomes less than a predetermined number, or when the number of iterations from S302 to S305 reaches a predetermined number.

As described above, by the flow of the described process, it is possible to highly accurately correct a phase singularity included in a phase image. Note that parameters used to prepare the interference fringe image in S302 and to create the fringe pattern in S303 may be set by the operator.

Figure 9:
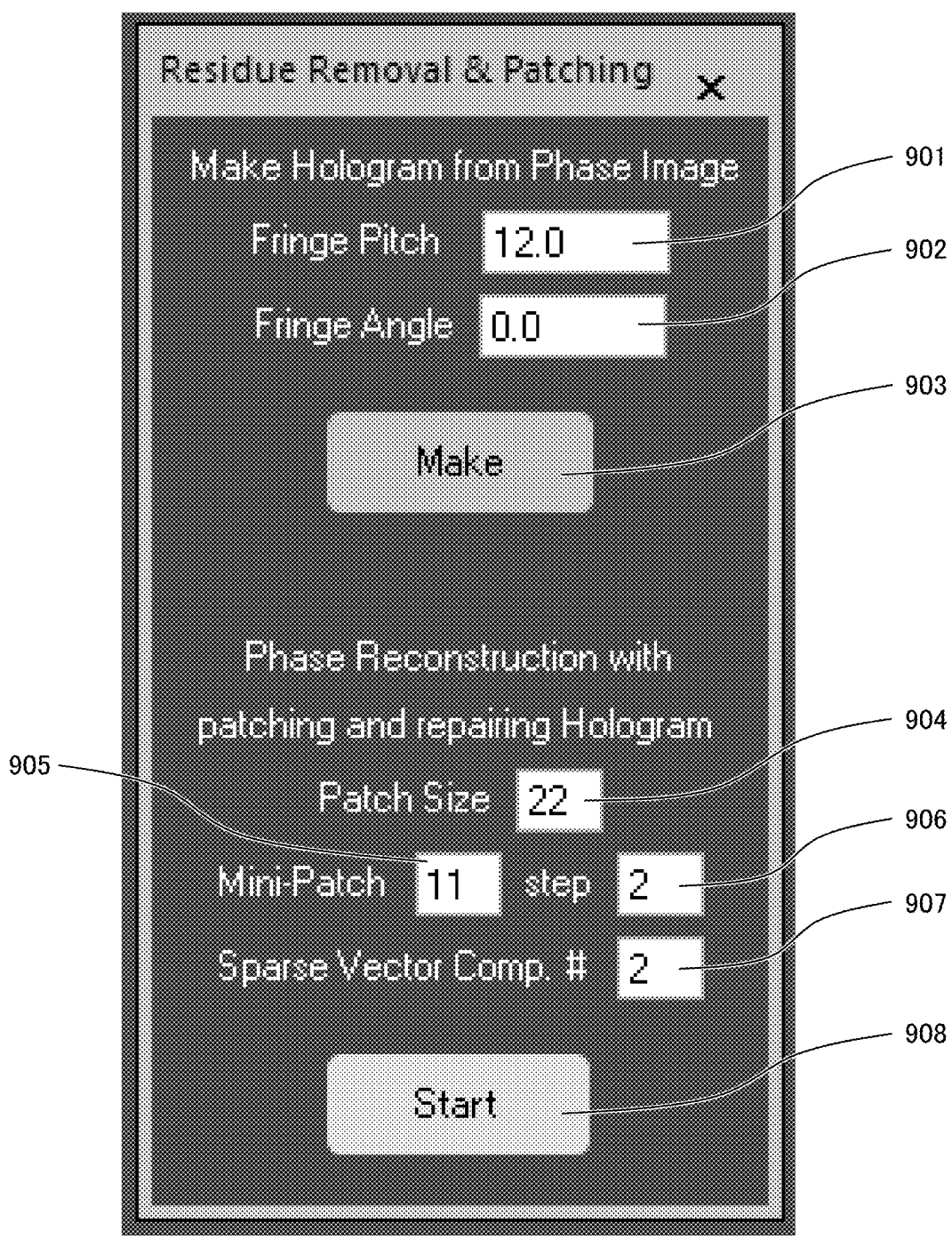
FIG. 9 is a diagram showing an example of a parameter input screen.

Referring to FIG. 9, an example of a parameter input screen displayed on the display device 107 will be described. The parameter input screen exemplified in FIG. 9 has a fringe pitch input unit 901, a fringe angle input unit 902, an interference fringe preparation button 903, an area size input unit 904, a pattern size input unit 905, a step input unit 906, an SCP input unit 907, and a start button 908.

To the fringe pitch input unit 901, the cycle of the interference fringe is input. To the fringe angle input unit 902, an angle indicating the direction of the interference fringe is input. The interference fringe preparation button 903 is pressed when the interference fringe image is prepared.

To the area size input unit 904, the size of the area corresponding to the defect area is input. To the pattern size input unit 905, the size of the fringe pattern is input. To the step input unit 906, the step when laying out the patch image in the region corresponding to the defect region is input. To the SCP input unit 907, a parameter used for the sparse coding algorithm is input. The start button 908 is pressed when starting the creation and pasting of the patch image.

As described above, the embodiment according to the present invention has been described. The present invention is not limited to the foregoing embodiment, and can be embodied by modifying the components without deviating from the gist of the invention. The plurality of components disclosed in the foregoing embodiment may be appropriately combined. Furthermore, some components may be deleted from all the components shown in the foregoing embodiment.

REFERENCE SIGNS LIST

101: phase-image processing apparatus
102: operational unit
103: memory
104: storage unit
105: network adapter
106: system bus
107: display device
108: input device
109: network
110: interference fringe image imaging device
111: image database
901: fringe pitch input unit
902: fringe angle input unit
903: interference fringe preparation button
904: area size input unit
905: pattern size input unit 906: step input unit
907: SCP input unit
908: start button

What is claimed is:

1. A phase-image processing apparatus that applies image processing to a phase image, the apparatus comprising:
   a fringe pattern-creating unit that creates a plurality of fringe patterns based on a first interference fringe image corresponding to a first phase image including a phase singularity;
   a patch image-creating unit that creates a patch image based on the plurality of fringe patterns;
   an interference fringe image correcting unit that pastes the patch image to an area of the first interference fringe image corresponding to the phase singularity, corrects the first interference fringe image, and creates a second interference fringe image; and
   a phase image correcting unit that creates a second phase image from the second interference fringe image,
   wherein the interference fringe image correcting unit determines a position where the patch image is to be pasted by identifying a center point of four adjacent pixels where a phase singularity is detected, and pastes the patch image such that a center of the patch image aligns with the center point of the phase singularity.

2. The phase-image processing apparatus according to claim 1, wherein the patch image-creating unit creates the patch image by weighted addition of the plurality of fringe patterns.

3. The phase-image processing apparatus according to claim 2, wherein the patch image-creating unit creates the patch image using a sparse coding algorithm.

4. The phase-image processing apparatus according to claim 1, wherein the fringe pattern-creating unit displays a screen to which a parameter used for creating the plurality of fringe patterns is input, and creates the plurality of fringe patterns using a parameter input to the screen.

5. The phase-image processing apparatus according to claim 1, wherein the first interference fringe image is created based on the first phase image.

6. The phase-image processing apparatus according to claim 1, wherein after the second phase image is created, a process in the fringe pattern-creating unit, a process in the patch image-creating unit, a process in the interference fringe image correcting unit, and a process in the phase image correcting unit are repeated until a number of phase singularities included in the second phase image reaches a predetermined number or less, or until a number of iterations reaches a predetermined number of times.

7. A phase-image processing method that applies image processing to a phase image, the method comprising:
   creating a plurality of fringe patterns based on a first interference fringe image corresponding to a first phase image including a phase singularity;
   creating a patch image based on the plurality of fringe patterns;
   pasting the patch image to an area of the first interference fringe image corresponding to the phase singularity, correcting the first interference fringe image, and creating a second interference fringe image; and
   creating a second phase image from the second interference fringe image,
   wherein the pasting of the patch image includes determining a position where the patch image is to be pasted by identifying a center point of four adjacent pixels where a phase singularity is detected, such that a center of the patch image aligns with the center point of the phase singularity.

8. The phase-image processing apparatus according to claim 1, wherein the fringe pattern-creating unit creates the plurality of fringe patterns by:
   obtaining a two-dimensional spatial frequency spectrum by discrete Fourier transforming the first interference fringe image;
   searching a position of peak intensity from the two-dimensional spatial frequency spectrum;
   extracting sidebands which are areas around the position of the peak intensity; and
   creating a stripe pattern corresponding to each coordinate in the sidebands.

9. The phase-image processing apparatus according to claim 8, wherein the fringe pattern-creating unit creates multiple stripe patterns with different phases by shifting a phase of the stripe pattern for each coordinate by one pixel.

10. The phase-image processing apparatus according to claim 1, wherein the phase singularity is determined based on a local circumferential integral of a phase gradient using four adjacent 2×2 pixels, and four pixels around the phase singularity are extracted as a defect area.

11. The phase-image processing apparatus according to claim 1, wherein the first interference fringe image is prepared from the first phase image using formula |exp [ikx]+exp[iφ(x,y)]|^2, where φ(x,y) is the first phase image, 2π/k is a fringe period of interference fringe to be created, and exp [ ] is an exponential function with a base of Napier number.

12. The phase-image processing apparatus according to claim 1, wherein a size of each of the plurality of fringe patterns is one-fourth of a size of an area corresponding to the phase singularity or less, and the size of each fringe pattern is 16 pixels or more.

13. The phase-image processing apparatus according to claim 1, wherein the fringe pattern-creating unit creates the plurality of fringe patterns by obtaining a two-dimensional spatial frequency spectrum by discrete Fourier transforming the first interference fringe image.

14. The phase-image processing apparatus according to claim 13, wherein the patch image-creating unit creates the patch image based on the plurality of fringe patterns by weighted addition of the plurality of fringe patterns.

15. A phase-image processing apparatus that applies image processing to a phase image, the apparatus comprising:
   a fringe pattern-creating unit that creates a plurality of fringe patterns based on a first interference fringe image corresponding to a first phase image including a phase singularity;
   a patch image-creating unit that creates a patch image based on the plurality of fringe patterns;
   an interference fringe image correcting unit that pastes the patch image to an area of the first interference fringe image corresponding to the phase singularity, corrects the first interference fringe image, and creates a second interference fringe image; and
   a phase image correcting unit that creates a second phase image from the second interference fringe image
   wherein a size of each of the plurality of fringe patterns is one-fourth of a size of an area corresponding to the phase singularity or less, and the size of each fringe pattern is 16 pixels or more,
   wherein a size of each of the plurality of fringe patterns is one-fourth of a size of an area corresponding to the phase singularity or less, and the size of each fringe pattern is 16 pixels or more.

* * * * *